(12) United States Patent  (10) Patent No.: US 8,604,512 B2
Morita  (45) Date of Patent: Dec. 10, 2013

(54) BIDIRECTIONAL SWITCH

(75) Inventor: Tatsuo Morita, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/463,631

(22) Filed: May 3, 2012

(65) Prior Publication Data

US 2012/0217542 A1  Aug. 30, 2012

Related U.S. Application Data

(63) Continuation of application No. PCT/JP2010/006621, filed on Nov. 11, 2010.

(30) Foreign Application Priority Data

Nov. 30, 2009  (JP) .................................. 2009-271744

(51) Int. Cl.
*H01L 29/66* (2006.01)

(52) U.S. Cl.
USPC .... 257/133; 257/173; 257/355; 257/E29.242; 257/E27.016

(58) Field of Classification Search
USPC .......... 257/E21.623, E29.143, 140, 133, 173, 257/355; 438/157, 283
See application file for complete search history.

(56) References Cited

U.S. PATENT DOCUMENTS

| 5,585,650 A | 12/1996 | Kumagai |
| 7,417,257 B2 * | 8/2008 | Beach et al. ..................... 257/79 |
| 7,868,353 B2 * | 1/2011 | Machida et al. ............... 257/133 |
| 8,203,376 B2 * | 6/2012 | Morita et al. .................. 327/427 |
| 2005/0189561 A1 | 9/2005 | Kinzer et al. |
| 2007/0278568 A1 | 12/2007 | Williams et al. |
| 2009/0206363 A1 | 8/2009 | Machida et al. |
| 2010/0097105 A1 | 4/2010 | Morita et al. |

FOREIGN PATENT DOCUMENTS

WO  WO 2007/142937 A2  12/2007
WO  WO 2008/062800 A1  5/2008

OTHER PUBLICATIONS

International Search Report issued in International Patent Application No. PCT/JP2010/006621, mailed Feb. 22, 2011.

* cited by examiner

*Primary Examiner* — Jarrett Stark
*Assistant Examiner* — Shahed Ahmed
(74) *Attorney, Agent, or Firm* — McDermott Will & Emery LLP (57) ABSTRACT

A bidirectional switch includes a semiconductor element and a substrate potential stabilizer. The semiconductor element includes a first ohmic electrode and a second ohmic electrode, and a first gate electrode and a second gate electrode, which are sequentially formed on the first ohmic electrode between the first ohmic electrode and the second ohmic electrode. The substrate potential stabilizer sets a potential of the substrate lower than higher one of a potential of the first ohmic electrode or a potential of the second ohmic electrode.

15 Claims, 9 Drawing Sheets

BIDIRECTIONAL SWITCH

CROSS-REFERENCE TO RELATED APPLICATION

This is a continuation of PCT International Application PCT/JP2010/006621 filed on Nov. 11, 2010, which claims priority to Japanese Patent Application No. 2009-271744 filed on Nov. 30, 2009. The disclosures of these applications including the specifications, the drawings, and the claims are hereby incorporated by reference in their entirety.

BACKGROUND

The present disclosure relates to bidirectional switches, and more particularly to bidirectional switches formed on conductive substrates and made of nitride semiconductor.

A bidirectional switch, which can conduct currents in both directions and can withstand both positive and negative voltages, is used as a main switch of a matrix converter capable of highly efficiently converting power, a main switch of a semiconductor relay, etc.

In a bidirectional switch, it is important to reduce switching loss caused by the product of a transient voltage and a transient current during switching, and conduction loss consumed by resistance of a semiconductor element itself at an on state (hereinafter referred to as "on-resistance"). However, where a bidirectional switch is formed of a silicon (Si) semiconductor element, the on-resistance is difficult to reduce due to the material limit of Si.

In order to overcome the material limit and reduce the conduction loss, employment of a semiconductor element made of nitride semiconductor represented by GaN or wide-gap semiconductor such as silicon carbide (SiC) is being considered. Wide-gap semiconductor has a higher breakdown field than Si by about one order of magnitude. In particular, charge is generated at the heterojunction interface between aluminum gallium nitride (AlGaN) and gallium nitride (GaN) due to spontaneous polarization and piezoelectric polarization. As a result, a two-dimensional electron gas (2DEG) layer is formed, which has a sheet carrier concentration of $1\times10^{13}$ cm$^{-2}$ or more and high mobility of 1000 cm$^{-2}$ V/sec or more even when it is undoped. Therefore, an AlGaN/GaN heterojunction field effect transistor (AlGaN/GaN-HFET) is expected as a power switching transistor with low on-resistance and a high breakdown voltage.

In particular, when an AlGaN/GaN-HFET has a dual gate structure, a bidirectional switch can be formed of a single semiconductor element (see for example, United States Patent Publication No. 2005/0189561). A dual-gate HFET is equivalent to two transistors coupled in series in opposite directions, and controls both of a current flowing from a first ohmic electrode to a second ohmic electrode, and a current flowing from the second ohmic electrode to the first ohmic electrode. Therefore, a dual-gate HFET can be miniaturized as compared to a conventional bidirectional switch formed by combining a plurality of power transistors such as power metal oxide semiconductor field effect transistors (MOSFETs) or insulated gate bipolar transistors (IGBTs), etc. In addition, a dual-gate structure is advantageous in reducing on-resistance as compared to the case where a bidirectional switch includes two MOSFETs coupled in series.

Furthermore, MOSFETs and IGBTs generally have low reverse breakdown voltages. Thus, where a bidirectional switch is provided using, for example, IGBTs, two IGBTs are coupled in parallel in opposite directions, and a diode needs to be coupled to each of the IGBTs in series. This is also applicable to power MOSFETs. However, a dual-gate HFET made of wide-gap semiconductor does not require any diode, since it has a high reverse breakdown voltage. Therefore, no loss is caused by on-resistance of a diode.

SUMMARY

However, the present inventor found that a bidirectional switch including the above-described dual-gate HFET has the following problems. A dual-gate HFETs is preferably formed on a Si substrate which is easily available at low cost. However, when a dual-gate HFET is formed on a conductive substrate such as a Si substrate, the potential of the substrate is not stable, and thus the operation of the bidirectional switch becomes unstable. The potential of the substrate can be fixed by coupling a first ohmic electrode or a second ohmic electrode to the substrate. In this case, however, an asymmetric potential is generated, thereby causing the problem that the operation of the bidirectional switch becomes unstable.

It is an objective of the present disclosure to solve the above-described problems, and provide a bidirectional switch which stably operates even when a wide-gap semiconductor is formed on a conductive substrate.

In order to achieve the objective, the present disclosure provides a bidirectional switch including a substrate potential stabilizer which applies to a substrate, the potential close to the lower one of the potential of the first ohmic electrode or the potential of the second ohmic electrode.

Specifically, an example bidirectional switch includes a semiconductor element formed on a substrate, and including a semiconductor multilayer, a first ohmic electrode and a second ohmic electrode, which are formed on the semiconductor multilayer and spaced apart from each other, and a first gate electrode and a second gate electrode which are sequentially formed from a side of the first ohmic electrode between the first ohmic electrode and the second ohmic electrode. A potential of the substrate is set lower than higher one of a potential of the first ohmic electrode or a potential of the second ohmic electrode by a substrate potential stabilizer.

The example bidirectional switch preferably further include the substrate potential stabilizer, which sets the potential of the substrate lower than the higher one of the potential of the first ohmic electrode or the potential of the second ohmic electrode. Thus, the potential of the substrate is never unstable, thereby providing the stably operating bidirectional switch. Different from the case where the potential of the substrate is fixed to the potential of the first ohmic electrode or the potential of the second ohmic electrode, potential asymmetric characteristics of the semiconductor element increase and the instability of the operation can be reduced.

In the example bidirectional switch, the semiconductor element may include a back surface electrode formed on a surface of the substrate, which is opposite to the semiconductor multilayer. The substrate potential stabilizer may include a first diode including a cathode coupled to the first ohmic electrode, and an anode coupled to the back surface electrode, and a second diode including a cathode coupled to the second ohmic electrode, and an anode coupled to the back surface electrode. With this configuration, the potential of the substrate can be set higher than the lower one of the potential of the first ohmic electrode or the potential of the second ohmic electrode by the potential corresponding to the forward turn-on voltage of the diode.

In the example bidirectional switch, the substrate potential stabilizer may include a first resistive element coupled to the first diode in parallel, and a second resistive element coupled to the second diode in parallel.

In the example bidirectional switch, the substrate potential stabilizer may include a first diode including a cathode coupled to the first ohmic electrode, and an anode coupled to the substrate, and a second diode including a cathode coupled to the second ohmic electrode, and an anode coupled to the substrate. The anode of the first diode may be a first anode electrode formed on the semiconductor multilayer. The anode of the second diode may be a second anode electrode formed on the semiconductor multilayer. The first anode electrode and the second anode electrode may be coupled to the substrate via a through-hole interconnect penetrating the semiconductor multilayer. This configuration integrates the semiconductor element with the substrate potential stabilizer.

In the example bidirectional switch, the substrate potential stabilizer may include a first resistive element coupling the first anode electrode to the first ohmic electrode, and a second resistive element coupling the second anode electrode to the second ohmic electrode. The semiconductor multilayer may include an inactive region having higher resistance than other regions. The first resistive element may be a resistive film formed on the inactive region in contact with the first ohmic electrode and the first anode electrode. The second resistive element may be a resistive film formed on the inactive region in contact with the second ohmic electrode and the second anode electrode.

In the example bidirectional switch, the first ohmic electrode may include a plurality of first ohmic electrode fingers. The second ohmic electrode may include a plurality of second ohmic electrode fingers. The first gate electrode may include a plurality of first gate electrode fingers. The second gate electrode may include a plurality of second gate electrode fingers. The semiconductor element may include a plurality of double-gate transistor units, each including the first gate electrode fingers and the second gate electrode fingers which are sequentially formed between the first ohmic electrode fingers and the second ohmic electrode fingers. The substrate potential stabilizer may include a diode unit including the first anode electrode and the second anode electrode which are sequentially formed between the first ohmic electrode fingers and the second ohmic electrode fingers.

In the example bidirectional switch, the semiconductor multilayer may include a channel region in which electrons move parallel to a principal surface of the substrate. The substrate potential stabilizer may include a normally-off transistor including a third ohmic electrode and a fourth ohmic electrode, which are formed on the semiconductor multilayer, and a third gate electrode formed between the third ohmic electrode and the fourth ohmic electrode, a first resistive element coupled between the first ohmic electrode and the third gate electrode, and a second resistive element coupled between the second ohmic electrode and the third gate electrode. The third ohmic electrode may be coupled to the first ohmic electrode. The fourth ohmic electrode may be coupled to the second ohmic electrode. The third gate electrode may be coupled to the substrate via a through-hole interconnect penetrating the semiconductor multilayer and insulated from the channel region. This configuration integrates the semiconductor element with the substrate potential stabilizer.

In the example bidirectional switch, the substrate potential stabilizer may include a p-type nitride semiconductor layer formed between the semiconductor multilayer and the third gate electrode.

In the example bidirectional switch, the semiconductor multilayer may include an inactive region having higher resistance than other regions. The through-hole interconnect may be formed in the inactive region.

In the example bidirectional switch, the first resistive element may be a resistive film formed on the inactive region in contact with the first ohmic electrode and the third gate electrode. The second resistive element may be a resistive film formed on the inactive region in contact with the second ohmic electrode and the third gate electrode.

In the example bidirectional switch, the first ohmic electrode may include a plurality of first ohmic electrode fingers. The second ohmic electrode may include a plurality of second ohmic electrode fingers. The first gate electrode may include a plurality of first gate electrode fingers. The second gate electrode may include a plurality of second gate electrode fingers. The semiconductor element may include a plurality of double-gate transistor units, each including the first gate electrode fingers and the second gate electrode fingers which are sequentially formed between the first ohmic electrode fingers and the second ohmic electrode fingers. The substrate potential stabilizer may include a single-gate transistor unit including the third gate electrode located between the first ohmic electrode fingers and the second ohmic electrode fingers. The first ohmic electrode fingers included in the single-gate transistor unit may form the third ohmic electrode. The second ohmic electrode fingers included in the single-gate transistor unit may form the fourth ohmic electrode.

In the example bidirectional switch, the semiconductor multilayer may include a first semiconductor layer, a second semiconductor layer formed on the first semiconductor layer, and a high-resistive region under the third gate electrode, the high-resistive region penetrating the second semiconductor layer to reach a position closer to the substrate than an interface between the second semiconductor layer and the first semiconductor layer, and having higher resistance than other regions of the first semiconductor layer and the second semiconductor layer.

According to the present disclosure, a bidirectional switch can be provided, which stably operates even if a wide-gap semiconductor element is formed on a conductive substrate.

BRIEF DESCRIPTION OF THE DRAWINGS

FIGS. 6A and 6B illustrate a variation of the bidirectional switch according to the embodiment.

FIGS. 9A-9D illustrate another variation of the bidirectional switch according to the embodiment.

DETAILED DESCRIPTION

Figure 1A:
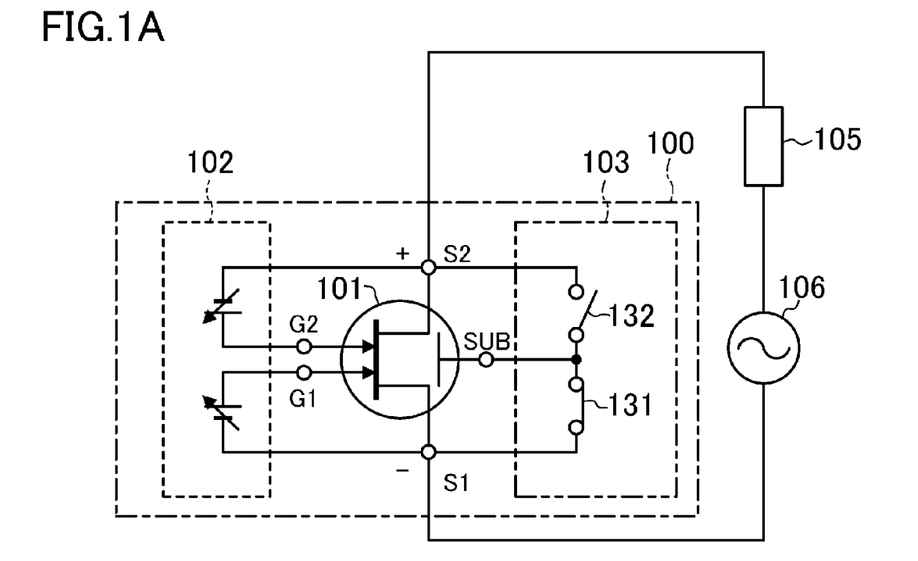
FIGS. 1A and 1B are schematic circuit diagrams illustrating a bidirectional switch according to an embodiment.
Figure 1B:
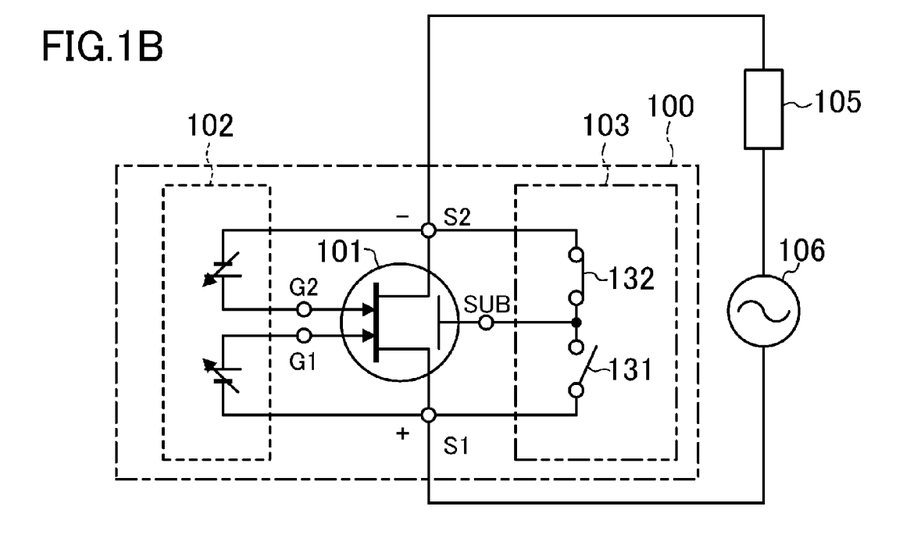

An embodiment will be described hereinafter with reference to the drawings. FIGS. 1A and 1B illustrate a circuit configuration of a bidirectional switch according to an embodiment. As shown in FIGS. 1A and 1B, a bidirectional switch 100 according to this embodiment includes a semiconductor element 101, a controller 102 for controlling the operation of the semiconductor element 101, and a substrate potential stabilizer 103 for stabilizing the substrate potential of the semiconductor element 101.

The controller 102 controls the bias voltages applied between a terminal S1 and a terminal G1, and between a terminal S2 and a terminal G2 of the semiconductor element 101. This conducts or shuts a current between the terminals S1 and S2 of the semiconductor element 101 in the both directions. As a result, the operation of a load 105 can be controlled when the load 105 and an alternate current power supply 106 are coupled between the terminals S1 and S2 of the semiconductor element 101.

The substrate potential stabilizer 103 includes a first switch 131 and a second switch 132. As shown in FIG. 1A, where the potential of the terminal S2 of the semiconductor element 101 is higher than the potential of the terminal S1, the first switch 131 is short-circuited and the second switch 132 is open. As a result, the potential of the substrate terminal SUB is substantially equal to the potential of the terminal S1. On the other hand, as shown in FIG. 1B, the potential of the terminal S2 of the semiconductor element 101 is lower than the potential of the terminal S1, the first switch 131 is open and the second switch 132 is short-circuited. As a result, the potential of the substrate terminal SUB is substantially equal to the potential of the terminal S2. As such, the potential of the substrate terminal SUB of the semiconductor element 101 is substantially equal to the lower one of the potential of the terminal S1 or the potential of the terminal S2. As such, since the substrate potential of the semiconductor element 101 is stabilized, the bidirectional switch can be stably operated. In addition, the difference between the potential of the substrate terminal SUB and the lower one of the potential of the terminal S1 or the potential of the terminal S2 never increases. This mitigates an increase in potential asymmetric characteristics of the semiconductor element 101, thereby stabilizing the operation of the bidirectional switch.

Different from the case where the substrate terminal SUB is coupled to the terminal S1 or the terminal S2, a semiconductor layer forming the semiconductor element 101 does not necessarily have a high bidirectional breakdown voltage. The potential of the terminal S2 may have a great positive value or a great negative value relative to the potential of the terminal S1. Thus, for example, where the substrate terminal SUB is directly coupled to the terminal S1, a high bipolar voltage is applied between the substrate terminal SUB and the terminal S2. Therefore, the semiconductor layer forming the semiconductor element 101 needs to have a bidirectional breakdown voltage. Specifically, the semiconductor layer withstands both positive and negative voltages. However, by providing the substrate potential stabilizer 103 as in this embodiment, the potential of the substrate terminal SUB is substantially equal to the lower one of the potential of the terminal S1 or the potential of the terminal S2. This provides the advantage of using a semiconductor layer having asymmetric breakdown voltage characteristics as the semiconductor layer forming the semiconductor element 101.

Figure 2:
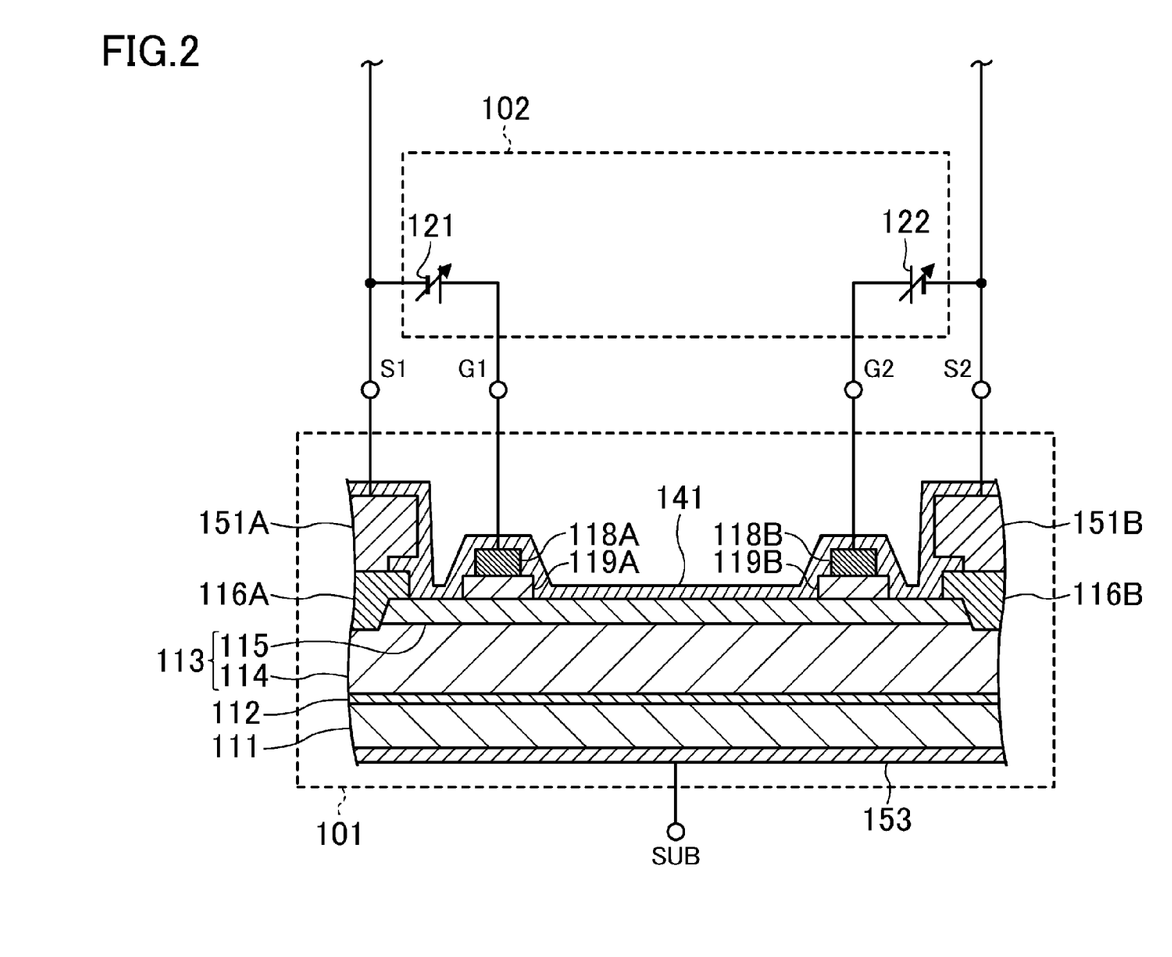
FIG. 2 is a cross-sectional view illustrating a semiconductor element used for the bidirectional switch according to the embodiment.

The bidirectional switch according to this embodiment will be described below in detail. First, the structure of the semiconductor element 101 will be described. FIG. 2 illustrates the cross-sectional structure of the semiconductor element 101 coupled to the controller 102.

As shown in FIG. 2, the semiconductor element 101 includes a buffer layer 112 with a thickness of about 1 μm on a conductive silicon (Si) substrate 111, and a semiconductor multilayer 113 formed on the buffer layer 112. The buffer layer 112 includes aluminum nitride (AlN) layers with a thickness of about 10 nm and gallium nitride (GaN) layers with a thickness of about 10 nm, which are alternately stacked one on another. The semiconductor multilayer 113 includes a first semiconductor layer 114 and a second semiconductor layer 115 which are sequentially formed on the substrate. The second semiconductor layer 115 has a greater bandgap than the first semiconductor layer 114. In this embodiment, the first semiconductor layer 114 is an undoped gallium nitride (GaN) layer with a thickness of about 2 μm, and the second semiconductor layer 115 is an n-type aluminum gallium nitride (AlGaN) layer with a thickness of about 20 nm.

Charge is generated near the heterojunction interface between the first semiconductor layer 114 made of GaN and the second semiconductor layer 115 made of AlGaN by spontaneous polarization and piezoelectric polarization. This generates a channel region, which is a two-dimensional electron gas (2DEG) layer having a sheet carrier concentration of $1 \times 10^{13}$ cm$^{-2}$ or more, and mobility of 1000 cm$^2$ V/sec or more.

A first ohmic electrode 116A and a second ohmic electrode 116B are formed on the semiconductor multilayer 113 and spaced apart from each other. The first ohmic electrode 116A and the second ohmic electrode 116B are multilayers of titanium (Ti) and aluminum (Al), and are in ohmic contact with the channel region. FIG. 2 shows an example where the first ohmic electrode 116A and the second ohmic electrode 116B come into contact with the interface between the first semiconductor layer 114 and the second semiconductor layer 115 to reduce contact resistance. Specifically, the second semiconductor layer 115 is selectively removed and the first semiconductor layer 114 is removed about 40 nm. The first ohmic electrode 116A and the second ohmic electrode 116B may be formed on the second semiconductor layer 115.

An S1 electrode interconnect 151A made of Au and Ti is formed on the first ohmic electrode 116A, and is electrically coupled to the first ohmic electrode 116A. An S2 electrode interconnect 151B made of Au and Ti is formed on the second ohmic electrode 116B, and is electrically coupled to the second ohmic electrode 116B.

A first p-type semiconductor layer 119A and a second p-type semiconductor layer 119B are selectively formed on the second semiconductor layer 115 between the first ohmic electrode 116A and the second ohmic electrode 116B to be spaced from each other. A first gate electrode 118A is formed on the first p-type semiconductor layer 119A, and a second gate electrode 118B is formed on the second p-type semiconductor layer 119B. The first gate electrode 118A and the second gate electrode 118B are multilayers of palladium (Pd) and gold (Au), and are in ohmic contact with the first p-type semiconductor layer 119A and the second p-type semiconductor layer 119B.

A protective film 141 made of silicon nitride (SiN) is formed to cover the S1 electrode interconnect 151A, the first ohmic electrode 116A, the second semiconductor layer 115, the first p-type semiconductor layer 119A, the first gate electrode 118A, the second p-type semiconductor layer 119B, the second gate electrode 118B, the second ohmic electrode 116B, and the S2 electrode interconnect 151B.

A back surface electrode 153, which is a multilayer of nickel (Ni), chrome (Cr), and silver (Ag) with a thickness of about 800 nm, is formed on the back surface of the Si substrate 111. The back surface electrode 153 is in ohmic contact with the Si substrate 111.

A terminal coupled to the first ohmic electrode 116A, a terminal coupled to the first gate electrode 118A, a terminal coupled to the second gate electrode 118B, and a terminal coupled to the second ohmic electrode 116B correspond to the terminal S1, the terminal G1, the terminal G2, and the terminal S2 of FIGS. 1A and 1B, respectively. A terminal coupled to the back surface electrode 153 corresponds to the substrate terminal SUB of FIGS. 1A and 1B.

Each of the first p-type semiconductor layer 119A and the second p-type semiconductor layer 119B has a thickness of about 300 nm and made of p-type GaN doped with magnesium (Mg). The first p-type semiconductor layer 119A and the second semiconductor layer 115, as well as the second p-type semiconductor layer 119B and the second semiconductor layer 115 form pn junctions. Thus, where the voltage between the first ohmic electrode 116A and the first gate electrode 118A is 0 V or lower, a depletion layer expands from the first p-type semiconductor layer 119A to the channel region, thereby shutting the current flowing to the channel. Similarly, where the voltage between the second ohmic electrode 116B and the second gate electrode 118B is 0 V or lower, a depletion layer expands from the second p-type semiconductor layer 119B to the channel region, thereby shutting the current flowing to the channel. Accordingly, a semiconductor element performing what is called normally-off operation can be provided. The distance between the first p-type semiconductor layer 119A and the second p-type semiconductor layer 119B is designed to withstand the maximum voltage applied to the first ohmic electrode 116A and the second ohmic electrode 116B.

The controller 102 includes a first power supply 121 coupled between the terminal S1 and the terminal G1, and a second power supply 122 coupled between the terminal S2 and the terminal G2. In this embodiment, each of the first power supply 121 and the second power supply 122 is a variable power supply capable of changing an output voltage. Alternatively, each of the first power supply 121 and the second power supply 122 may be a gate circuit etc. including a power supply in place of a variable power supply.

The voltage of the first power supply 121 is set lower than the threshold voltage of the first gate electrode 118A so that the depletion layer expands below the first gate electrode 118A. The voltage of the second power supply 122 is set lower than the threshold voltage of the second gate electrode 118B so that the depletion layer expands below the second gate electrode 118B. With this configuration, no current flows in the both directions between the terminal S1, which is the first ohmic electrode 116A, and the terminal S2, which is the second ohmic electrode 116B. Where the voltage of the first power supply 121 is equal to or higher than the threshold voltage of the first gate electrode 118A, and the voltage of the second power supply 122 is equal to or higher than the threshold voltage of the second gate electrode 118B; currents flow in the both directions between the terminal S1 and the terminal S2. Where the voltage of the first power supply 121 is equal to or higher than the threshold voltage of the first gate electrode 118A, and the voltage of the second power supply 122 is lower than the threshold voltage of the second gate electrode 118B; no current flows from the terminal S1 to the terminal S2, but a current flows from the terminal S2 to the terminal S1. Where the voltage of the first power supply 121 is lower than the threshold voltage of the first gate electrode 118A, and the voltage of the second power supply 122 is equal to or higher than the threshold voltage of the first gate electrode 118A; a current flows from the terminal S1 to the terminal S2, and no current flows from the terminal S2 to the terminal S1.

Figure 3:
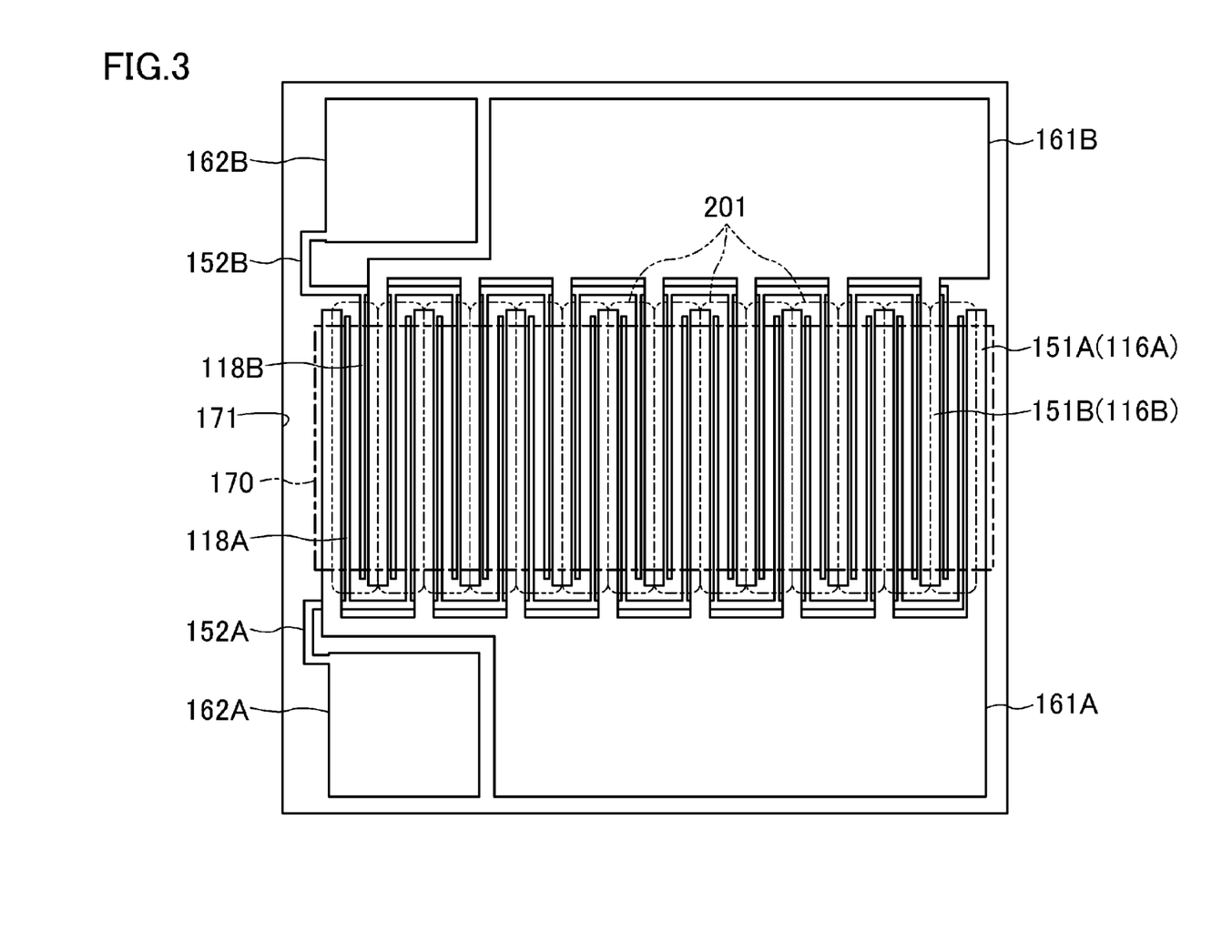
FIG. 3 is a top view illustrating the semiconductor element used for the bidirectional switch according to the embodiment.

The semiconductor element 101 is generally of a multi-finger type to increase current capacity. FIG. 3 illustrates the structure of the semiconductor element 101 viewed from above, where it is of a multi-finger type. As shown in FIG. 3, the semiconductor multilayer 113 includes an active region 170, and an inactive region 171 surrounding the active region 170. The inactive region 171 is a region in which iron (Fe) is diffused, and has higher resistance than the active region. The diffusion of Fe is performed by ion implantation. Fe may be diffused in a depth of about 400 nm from the surface of the semiconductor multilayer 113. In the active region 170, each of the first ohmic electrode 116A and the second ohmic electrode 116B includes a plurality of fingers. The fingers of the first ohmic electrode 116A and the fingers of the second ohmic electrode 116B are alternately formed in parallel. Note that, in FIG. 3, the first ohmic electrode 116A and the second ohmic electrode 116B are hidden below the S1 electrode interconnect 151A and the S2 electrode interconnect 151B. A finger of the first gate electrode 118A and a finger of the second gate electrode 118B are formed in each region between the fingers of the first ohmic electrode 116A and the fingers of the second ohmic electrode 116B. As a result, a plurality of double-gate transistor units 201 are formed, each of which includes one of the fingers of the first ohmic electrode 116A, one of the fingers of the first gate electrode 118A, one of the fingers of the second gate electrode 118B, and one of the fingers of the second ohmic electrode 116B. The double-gate transistor units 201 are alternately arranged in reverse directions. Therefore, adjacent two of the double-gate transistor units 201 share one of the fingers of the first ohmic electrode 116A or one of the fingers of the second ohmic electrode 116B. Although not shown in FIG. 3, the fingers of the first gate electrode 118A and the fingers of the second gate electrode 118B are formed on the first p-type semiconductor layer and the second p-type semiconductor layer, respectively. The cross-sectional structures of the double-gate transistor units 201 are the same as that shown in FIG. 2.

An S1 electrode pad 161A, an S2 electrode pad 161B, a G1 electrode pad 162A, and a G2 electrode pad 162B, which are made of Ti and Au, are formed on the inactive region 171. The S1 electrode pad 161A is coupled to the fingers of the first ohmic electrode 116A via the S1 electrode interconnect 151A. The S2 electrode pad 161B is coupled to the fingers of the second ohmic electrode 116B via the S2 electrode interconnect 151B. The G1 electrode pad 162A is coupled to the fingers of the first gate electrode 118A via a G1 electrode interconnect 152A. The G2 electrode pad 162B is coupled to the fingers of the second gate electrode 118B via a G2 electrode interconnect 152B. The G1 electrode interconnect 152A and the G2 electrode interconnect 152B are preferably made of the same material as the first gate electrode or the second gate electrode.

Figure 4:
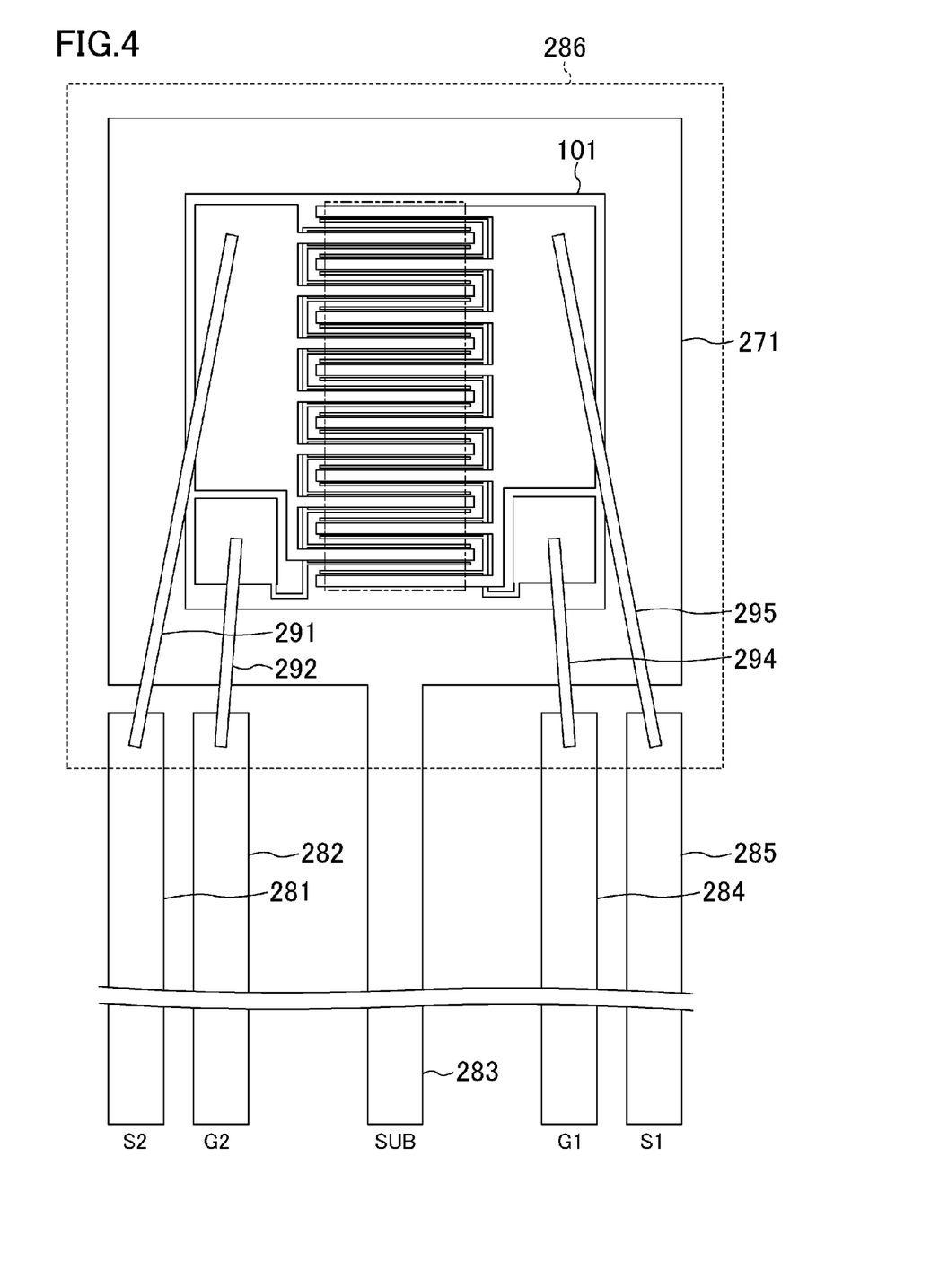
FIG. 4 is a top view illustrating a package of the semiconductor element used for the bidirectional switch according to the embodiment.

FIG. 4 illustrates an example where the semiconductor element 101 shown in FIG. 3 is contained in a package. As shown in FIG. 4, the semiconductor element 101 is contained in a semiconductor package of five pins. The semiconductor element 101 is mounted on a die pad 271 which is integrated with a SUB terminal lead 283. The back surface electrode of the semiconductor element 101 is bonded to the die pad 271 using a solder technique etc. The SUB terminal lead 283 corresponds to the substrate terminal SUB of the semiconductor element 101. An S2 terminal lead 281 is coupled to the S2 electrode pad 161B via a wire 291, and corresponds to the terminal S2. The G2 terminal lead 282 is coupled to the G2 electrode pad 162B via a wire 292, and corresponds to the terminal G2. A G1 terminal lead 284 is coupled to the G1 electrode pad 162A via a wire 294, and corresponds to the terminal G1. An S1 terminal lead 285 is coupled to the S1 electrode pad 161A via a wire 295, and corresponds to the terminal S1.

Resin 286 is formed to cover the semiconductor element 101, the die pad 271, the wire 291, the wire 292, the wire 294, the wire 295, part of the S2 terminal lead 281, part of the G2 terminal lead 282, part of the SUB terminal lead 283, part of the G1 terminal lead 284, and part of the S1 terminal lead 285. In order to improve heat release properties, the surface (i.e., the back surface) of the die pad 271, which is opposite to the surface on which the semiconductor element 101 is mounted, may not cover with the resin 286. Alternatively, when cooling in an external cooling device, the cooling device is electrically insulated from the die pad 271, the back surface of the die pad 271 is covered with the resin 286, and the semiconductor element 101 may be cooled via part of the resin 286. In order to further improve the heat release properties, the die pad 271 is insulated from the cooling device not via the resin 286 but via other members. In this case, the back surface of the die pad 271 may not be covered with the resin 286.

By combining the semiconductor element 101 having such a structure with the controller 102 and the substrate potential stabilizer 103, the potential of the substrate terminal SUB can be the lower one of the potential of the terminal S1 or the potential of the terminal S2. This stabilizes the potential of the substrate 111 of the semiconductor element 101, thereby stably operating the bidirectional switch. For example, where the first ohmic electrode 116A is coupled to the substrate 111, and the potential of the first ohmic electrode 116A is lower than the potential of the second ohmic electrode 116B, the potential of the substrate 111 is also lower than the potential of the second ohmic electrode. On the other hand, where the potential of the first ohmic electrode 116A is higher than the potential of the second ohmic electrode 116B, the potential of the substrate 111 is also higher than the potential of the second ohmic electrode. Thus, the semiconductor multilayer 113 needs to have the bidirectional breakdown voltages from the second ohmic electrode 116B to the substrate 111 and from the substrate 111 to the second ohmic electrode 116B. Similarly, where the second ohmic electrode 116B is directly coupled to the substrate 111, the semiconductor multilayer 113 needs to have the bidirectional breakdown voltages. However, where the substrate potential stabilizer 103 of this embodiment is used, the potential of the substrate 111 is never higher than the first ohmic electrode 116A or the potential of the second ohmic electrode 116B. Therefore, the semiconductor multilayer 113 does not need to have high bidirectional breakdown voltages. The semiconductor multilayer may have asymmetric breakdown voltage characteristics such that at least the multilayer is not damaged where the potential of the first ohmic electrode 116A or the potential of the second ohmic electrode 116B is higher than the potential of the substrate 111. Furthermore, since the semiconductor element 101 is under the same conditions as the conditions where a source is coupled to the substrate in a conventional AlGaN/GaN-HFET, the concentration of an electric field near the gate can be reduced, thereby reducing current collapse.

The substrate potential stabilizer 103 reduces the great negative potential difference, which exceeds the breakdown voltage of the semiconductor multilayer 113, occurs between the substrate 111 and the first ohmic electrode 116A, and between the substrate 111 and the second ohmic electrode 116B. Thus, there is no need to set the potential of the substrate 111 equal to the lower one of the potential of the first ohmic electrode 116A or the potential of the second ohmic electrode 116B. The potential of the substrate 111 needs to be equal to or higher than the lower one of the potential of the first ohmic electrode 116A or the potential of the second ohmic electrode 116B. The difference between the potential of the substrate 111 and the lower one of the potential of the first ohmic electrode 116A or the potential of the second ohmic electrode 116B needs to be equal to or lower than the negative breakdown voltage of the semiconductor multilayer 113.

Figure 5:
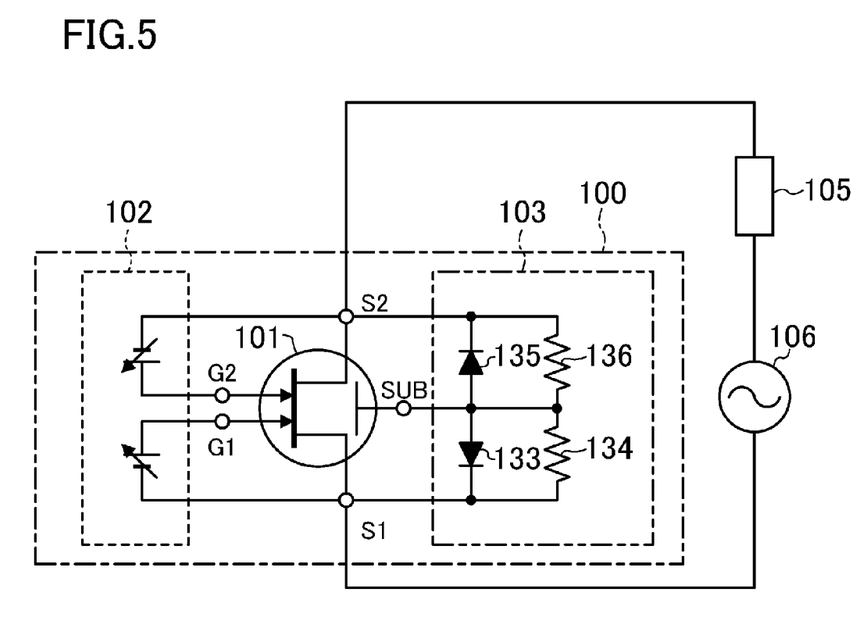
FIG. 5 is a circuit diagram illustrating a specific example of a substrate potential stabilizer of the bidirectional switch according to the embodiment.

FIG. 5 illustrates an example of a specific circuit configuration of the substrate potential stabilizer 103. As shown in FIG. 5, the substrate potential stabilizer 103 includes a first diode 133 and a first resistor 134 in place of the first switch 131, and a second diode 135 and a second resistor 136 in place of the second switch 132. The first diode 133 is coupled between the substrate terminal SUB and the terminal S1. The second diode 135 is coupled between the substrate terminal SUB and the terminal S2. The first resistor 134 is coupled to the first diode 133 in parallel. The second resistor 136 is coupled to the second diode 135 in parallel. The first diode 133 and the second diode 135 have sufficient breakdown voltage to the voltage applied to the semiconductor element 101.

Operation of the substrate potential stabilizer 103 shown in FIG. 5 will be described below. Where the potential of the terminal S2 is higher than that of the terminal S1, a minute current flows from the terminal S2 to the terminal S1 via the second resistor 136 and the first diode 133. Since the minute current flows to the first diode 133 in a forward direction, a potential corresponding to the forward turn-on voltage of the diode is generated at the first diode 133. For example, in the case of a Si diode, since a potential of about 0.6 V is generally generated, a potential higher than the potential of the terminal S1 by about 0.6 V can be applied to the substrate terminal SUB, thereby stabilizing the potential of the substrate.

Where the potential of the terminal S2 is lower than that of the terminal S1, a minute current flows from the terminal S1 to the terminal S2 via the first resistor 134 and the second diode 135. Since the minute current flows to the second diode 135 in a forward direction, the potential corresponding to the forward turn-on voltage of the diode occurs at the second diode 135. Thus, a potential higher than the potential of the terminal S2 by about 0.6 V can be applied to the substrate terminal SUB, thereby stabilizing the potential of the substrate.

Where leakage currents of the first diode 133 and the second diode 135 are substantially equal to the minute current flowing via the first resistor 134 and the second resistor 136, there is no need to provide the first resistor 134 and the second resistor 136.

Figure 6A:
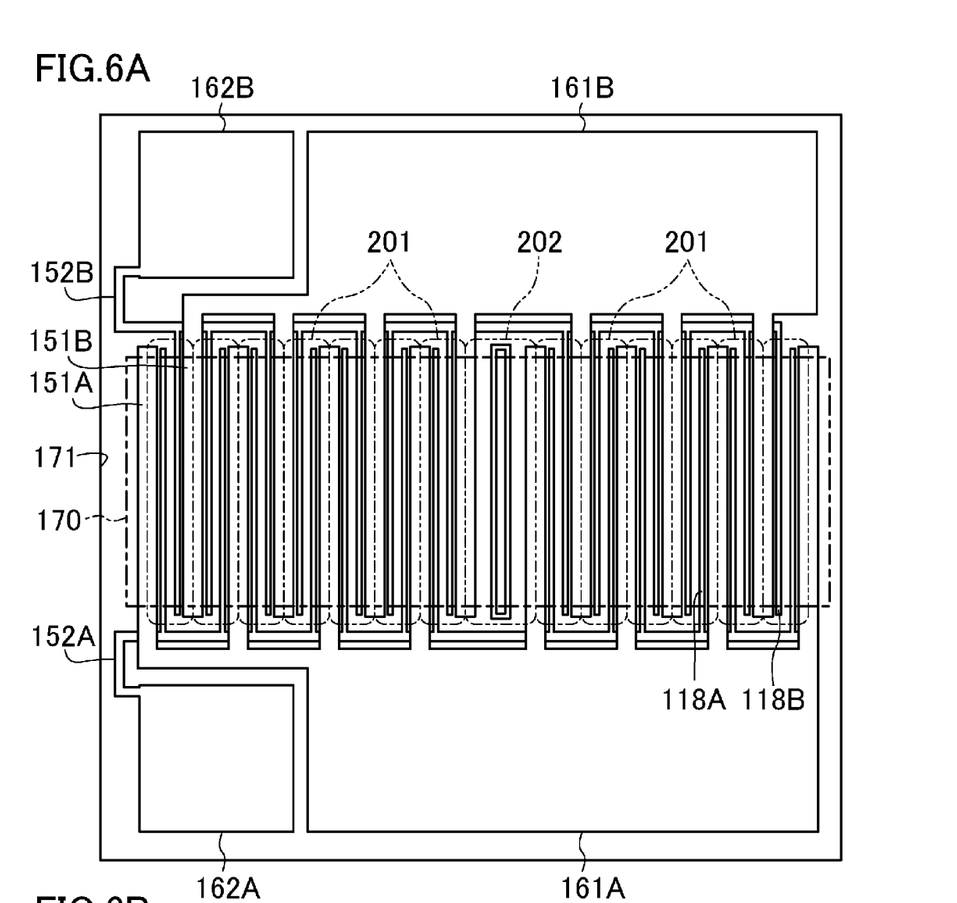
FIG. 6A is a top view.
Figure 6B:
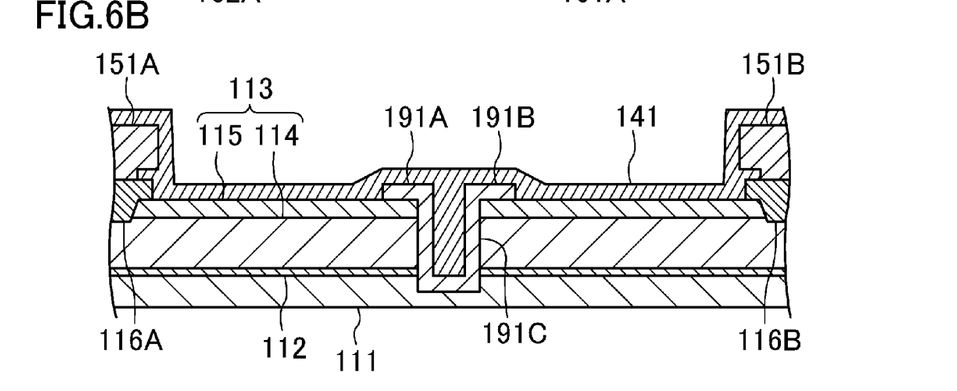
FIG. 6B is an enlarged cross-sectional view of a diode unit.

The first diode 133 and the second diode 135 can be formed on the same substrate as the semiconductor element 101. In this case, for example, there is no need to form external wirings where the structure shown in FIGS. 6A and 6B is used. As shown in the structure of FIG. 6A viewed from above, a diode unit 202, which includes a first diode and a second diode, is formed together with the plurality of double-gate transistor units 201. As shown in the cross-sectional structure of FIG. 6B, the diode unit 202 includes the first anode electrode 191A and the second anode electrode 191B between the fingers of the first ohmic electrode 116A and the fingers of the second ohmic electrode 116B. The first anode electrode 191A and the second anode electrode 191B are made of nickel (Ni), palladium (Pd), etc., and form a Schottky junction with the 2DEG layer. As a result, the first anode electrode 191A and the 2DEG layer form the first diode, which is a Schottky diode. The second anode electrode 191B and the 2DEG layer form the second diode, which is a Schottky diode. The cathode of the first diode is coupled to the first ohmic electrode 116A by the 2DEG layer. The cathode of the second diode is coupled to the second ohmic electrode 116B via the 2DEG layer.

The first anode electrode 191A and the second anode electrode 191B are formed to penetrate the semiconductor multilayer 113 and to cover the side surfaces and bottom of the recess, which exposes the substrate 111, and the top of the semiconductor multilayer 113 near the recess. This allows the first anode electrode 191A and the second anode electrode 191B to efficiently form the Schottky junction with the 2DEG layer. The portion covering the side surfaces and the bottom of the recess is the through-hole interconnect 191C, which is a via coupling the first anode electrode 191A and the second anode electrode 191B to the substrate 111. Therefore, the anodes of the first diode and the second diode can be coupled to the substrate 111 without providing any external wiring.

The first anode electrode 191A, the second anode electrode 191B, and the through-hole interconnect 191C which is integrated with the first anode electrode 191A and the second anode electrode 191B, are formed to cross the active region 170. The first ohmic electrode 116A and the second ohmic electrode 116B are never short-circuited by the 2DEG layer.

Note that the first resistor 134 and the second resistor 136 shown in FIG. 5 may not be used, where reverse leakage currents of the first diode 133 and the second diode 135, which are formed by the diode unit 202, are slightly greater than usual. For example, the reverse leakage current of the second diode 135 flows to the first diode 133 in a forward direction, thereby applying to the substrate, the potential determined by the forward turn-on characteristics. When the potential of the substrate is floating, the potential of the substrate is inconstant. Thus, the potential of the substrate influences the electric characteristics such as on-resistance of the device at the time of switching to cause instability of the operation of the bidirectional switch. By applying the potential determined by the forward turn-on characteristics, a desired on-resistance and a desired switching rate can be obtained even at the time of switching. This stabilizes the operation of the bidirectional switch.

FIG. 5 illustrates the example where the potential between the first ohmic electrode and the second ohmic electrode is produced using the first diode and the second diode. However, as long as the operation of the bidirectional switch can be stabilized, the potential between the first ohmic electrode and the second ohmic electrode may be produced by a voltage divider using a resistor or the like. When the voltage is divided by the resistor, the first diode and the second diode may be omitted in FIG. 5. However, when the first diode and the second diode are used, the operation of the bidirectional switch can be stabilized more.

Figure 7:
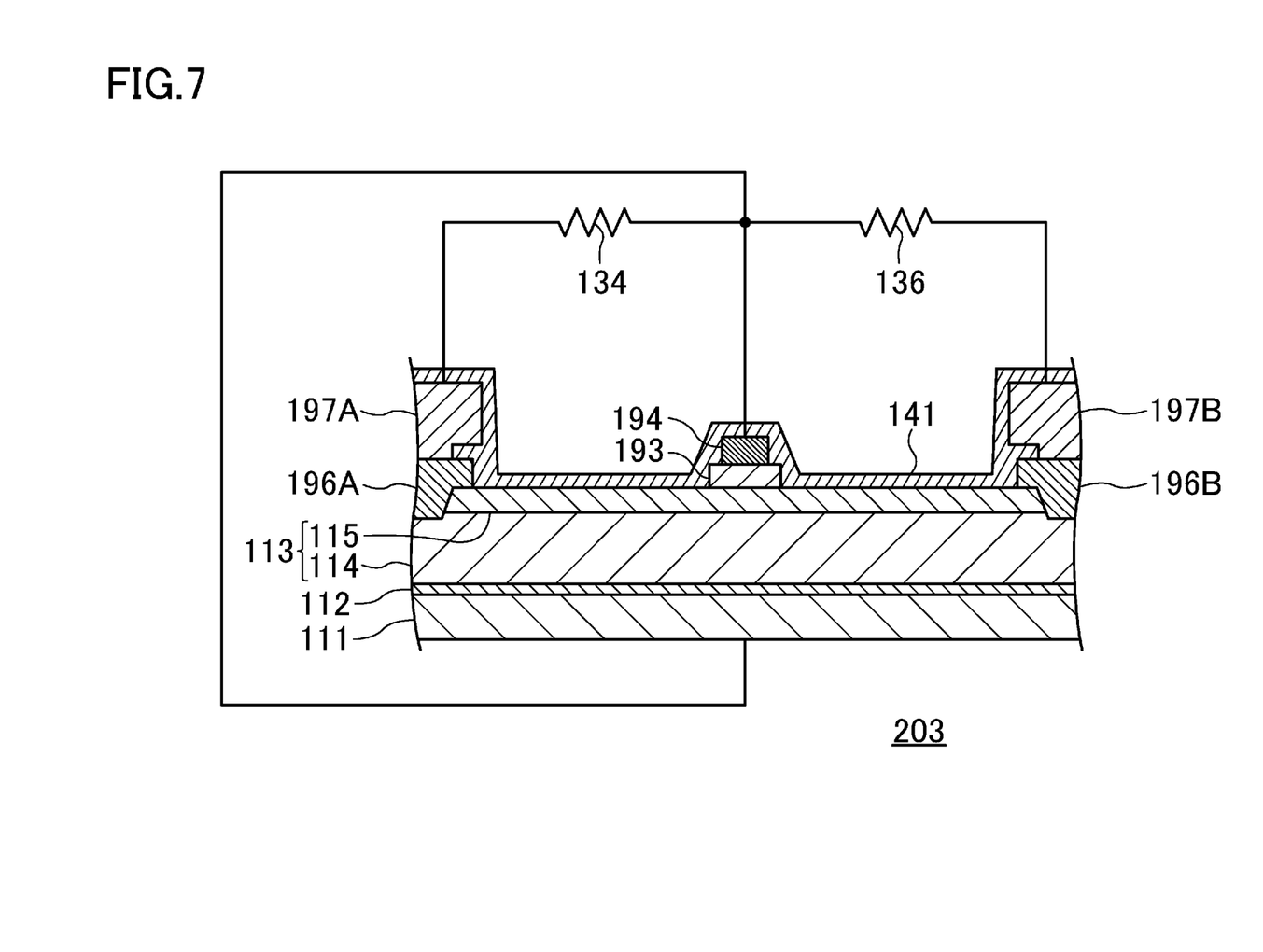
FIG. 7 illustrates a variation of the substrate potential stabilizer of the bidirectional switch according to the embodiment.

The substrate potential stabilizer may be formed by transistors and resistors in place of the diodes. In this case, for example, as shown in FIG. 7, a single-gate transistor unit 203 is formed, which includes a third p-type semiconductor layer 193 formed on the semiconductor multilayer 113 between a third ohmic electrode 196A and a fourth ohmic electrode 196B, and a third gate electrode 194 formed on the third p-type semiconductor layer 193. The third ohmic electrode 196A may be coupled to the first ohmic electrode 116A via an S3 electrode interconnect 197A. The fourth ohmic electrode 196B is coupled to the second ohmic electrode 116B via an S4 electrode interconnect 197B. The third gate electrode 194 is coupled to the back surface electrode 153.

In the single-gate transistor unit 203 shown in FIG. 7, where the potential of the fourth ohmic electrode 196B is higher than the potential of the third ohmic electrode 196A, a current flows from the fourth ohmic electrode 196B to the third ohmic electrode 196A via the second resistor 136, the third gate electrode 194, and the third p-type semiconductor layer 193. Thus, a forward current flows to a pn junction diode formed by the third p-type semiconductor layer 193 and the 2DEG layer, thereby generating a forward turn-on voltage. As a result, the potential of the third gate electrode 194 becomes higher than the potential of the third ohmic electrode 196A by about 3V, and the potential of the substrate 111 coupled to the third gate electrode 194 has the equal potential. Where the potential of the fourth ohmic electrode 196B is lower than the potential of the third ohmic electrode 196A, a current flows from the third ohmic electrode 196A to the fourth ohmic electrode 196B via the first resistor 134, the third gate electrode 194, and the third p-type semiconductor layer 193. Thus, a forward current flows to the pn junction diode formed by the third p-type semiconductor layer 193 and the semiconductor multilayer 113, thereby generating a forward turn-on voltage. As a result, the potential of the third gate electrode 194 becomes higher than the potential of the fourth ohmic electrode 196B by about 3V, and the potential of the substrate 111 coupled to the third gate electrode 194 has the equal potential. The third ohmic electrode 196A is coupled to the first ohmic electrode 116A, and the potential of the third ohmic electrode 196A is equal to the potential of the first ohmic electrode 116A. On the other hand, the fourth ohmic electrode 196B is coupled to the second ohmic electrode 116B, and the potential of the fourth ohmic electrode 196B is equal to the potential of the second ohmic electrode 116B. Therefore, a potential, which is substantially equal to the lower one of the potential of the first ohmic electrode 116A or the potential of the second ohmic electrode 116B, is applied to the substrate 111, thereby providing a stably operating bidirectional switch.

Figure 8:
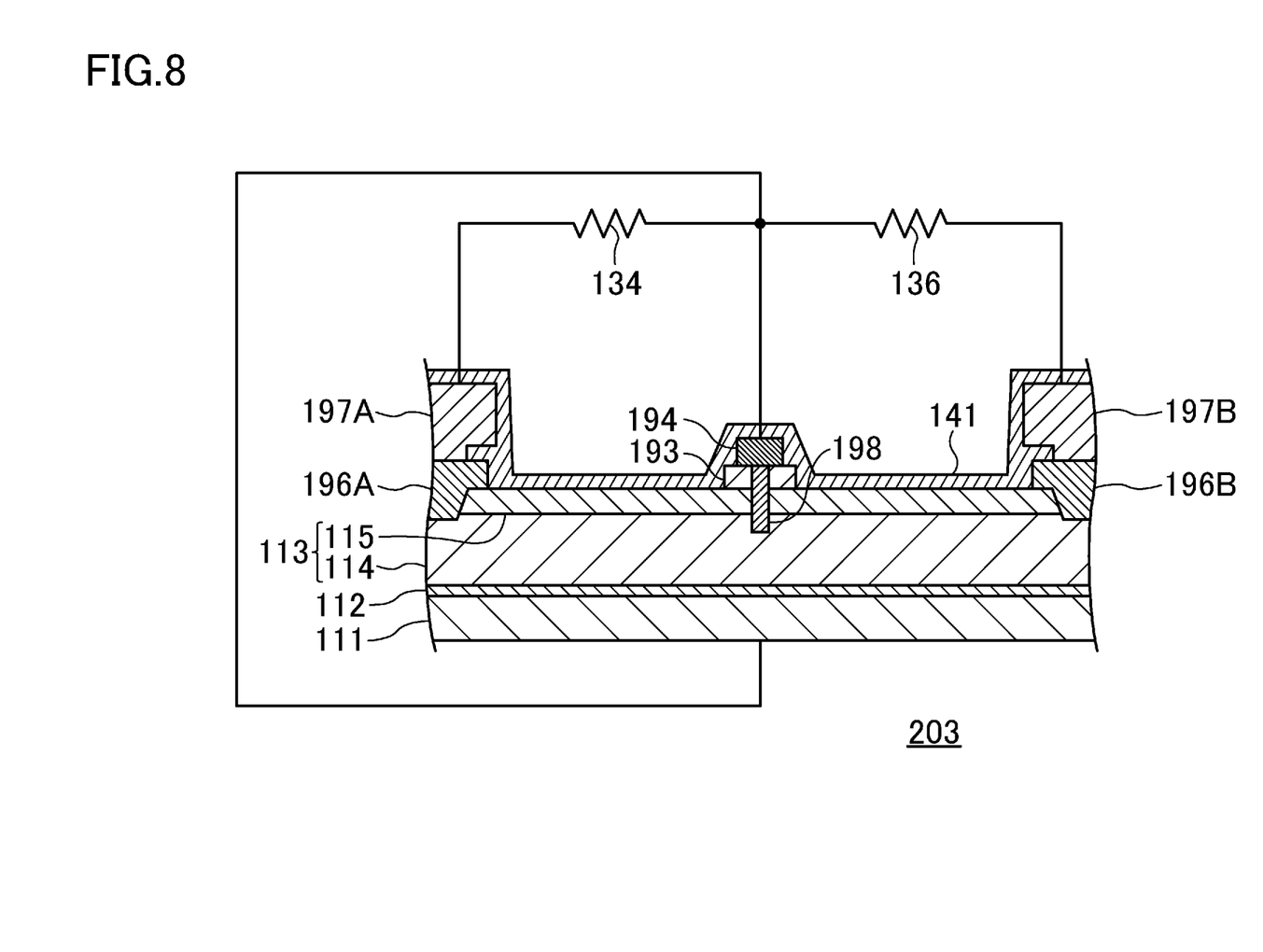
FIG. 8 illustrates another variation of the substrate potential stabilizer of the bidirectional switch according to the embodiment.

Note that, as shown in FIG. 8, a high-resistive region 198 may be provided, which penetrates the third p-type semiconductor layer 193 and the second semiconductor layer 115, and extends closer to the substrate 111 than the interface between the first semiconductor layer 114 and the second semiconductor layer 115. The high-resistive region 198 may across a channel layer formed at the interface between the first semiconductor layer 114 and the second semiconductor layer 115. Therefore, where the single-gate transistor unit 203 is of a normally-off type without using the third p-type semiconductor layer 193, the high-resistive region 198 may be formed in the second semiconductor layer 115 and the first semiconductor layer 114. By forming the high-resistive region 198, leakage paths can be formed, thereby providing a higher resistive bidirectional switch. The high-resistive region 198 may be formed by ion implantation of boron ions, or iron ions etc. With use of ion implantation, a higher resistive region can be selectively formed.

Figure 9A:
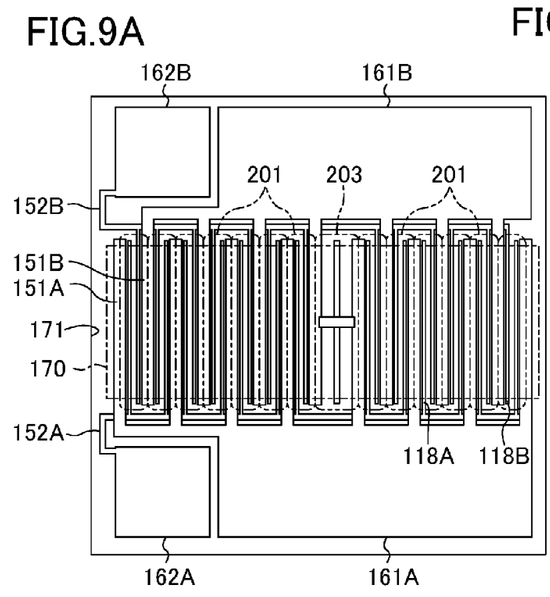
FIG. 9A is a top view.
Figure 9B:
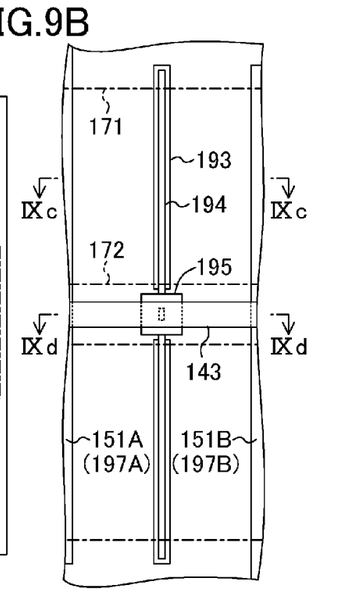
FIG. 9B is an enlarged top view of a single-gate transistor unit.
Figure 9C:
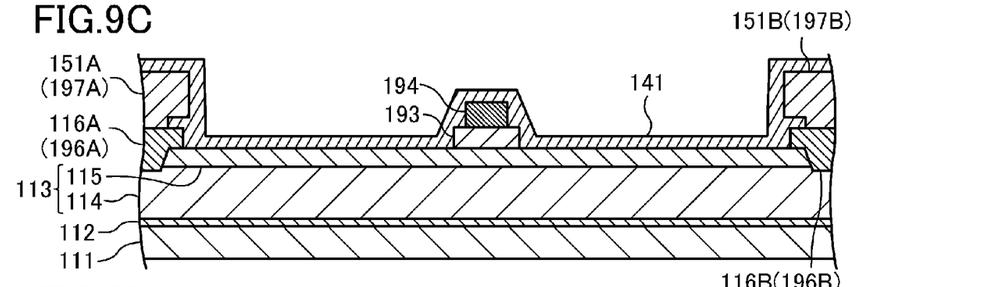
FIG. 9C is a cross-sectional view taken along the line IXc-IXc of FIG. 9B.
Figure 9D:
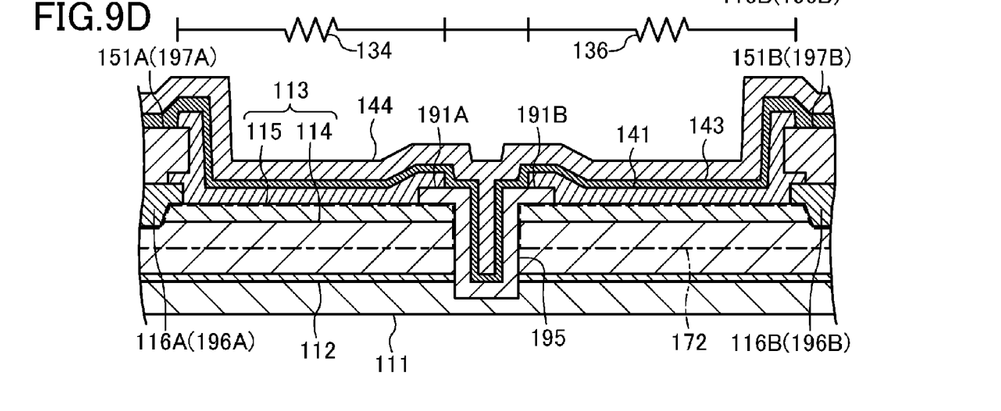
FIG. 9D is a cross-sectional view taken along the line IXd-IXd of FIG. 9B.

FIG. 9A-9D illustrate an example where the single-gate transistor unit 203 formed of a single-gate transistor is integrated with the semiconductor element 101. FIG. 9A illustrates the entire structure viewed from above. FIG. 9B is an enlarged view of the single-gate transistor unit 203. FIG. 9C illustrates a cross-sectional structure taken along the line IXc-IXc of FIG. 9B. FIG. 9D illustrates a cross-sectional structure taken along the line IXd-IXd of FIG. 9B. As shown in FIGS. 9A-9D, a plurality of double-gate transistor units 201 and the single-gate transistor unit 203 are formed on the substrate. The third ohmic electrode 196A may be one of the fingers of the first ohmic electrode 116A. The fourth ohmic electrode 196B may be one of the fingers of the second ohmic electrode 116B. The S3 electrode interconnect 197A may be integrally formed with the S1 electrode interconnect 151A. The S4 electrode interconnect 197B may be integrally formed with the S2 electrode interconnect 151B.

The single-gate transistor unit 203 includes in the center, an inactive region 172 formed by diffusing Fe ions. The third p-type semiconductor layer 193 and the third gate electrode 194 are formed from the inactive region 171 to the inactive region 172.

The third p-type semiconductor layer 193 may be made of any material as long as it is a p-type nitride semiconductor layer. For example, it may be made of p-type GaN. The third gate electrode 194 may be made of a material which can form an ohmic contact with the third p-type semiconductor layer 193. It may be, for example, a multilayer of Pd and Au. If the third p-type semiconductor layer 193 is made of the same material as the first p-type semiconductor layer 119A and the second p-type semiconductor layer 119B, it can be formed by the same fabrication process as the first p-type semiconductor layer 119A and the second p-type semiconductor layer 119B. If the third gate electrode 194 is made of the same material as the first gate electrode 118A and the second gate electrode 118B, it can be formed by the same manufacturing process as the first gate electrode 118A and the second gate electrode 118B. However, the third p-type semiconductor layer 193 is not necessarily made of the same material as the first p-type semiconductor layer 119A and the second p-type semiconductor layer 119B. Also, the third gate electrode 194 is not necessarily made of the same material as the first gate electrode 118A and the second gate electrode 118B.

Since the depletion layer expands below the third p-type semiconductor layer 193 while no voltage is applied to the third gate electrode 194, the third ohmic electrode 196A and the fourth ohmic electrode 196B are never short-circuited by a channel region. In FIGS. 9A-9D as well, the high-resistive region 198, which penetrates the second semiconductor layer 115, and reaches a position closer to the substrate 111 than the interface between the second semiconductor layer 115 and the first semiconductor layer 114, may be formed under the third gate electrode 194 other than the inactive region 172. This further reduces leakage paths.

The third gate electrode 194 is coupled to the substrate 111 via a through-hole interconnect 195. The through-hole interconnect 195 may be, for example, an Au film covering the side surfaces and the bottom of a via hole which penetrates the semiconductor multilayer 113. The through-hole interconnect 195, which couples the third gate electrode 194 to the substrate 111, needs to be insulated from the 2DEG layer which is a channel region. Thus, the through-hole interconnect 195 is formed in the inactive region 172. The interconnect coupling the third gate electrode 194 to the through-hole interconnect may be provided in any form. If it is integrally formed with the third gate electrode 194 using the same material, the interconnect can be easily formed.

In this embodiment, a first resistor and a second resistor are also formed on the semiconductor multilayer 113. The first resistor and the second resistor are formed of a resistive film 143 on the protective film 141 in the inactive region 172. The resistive film 143 is made of, for example, tungsten silicon nitride (WSiN) etc., and is coupled to the S1 electrode interconnect 151A, the S2 electrode interconnect 151B, and the through-hole interconnect 195 at the opening formed in the protective film 141. The resistive film 143 is covered by an insulating film 144 made of SiN.

The transistor included in the substrate potential stabilizing unit may be of a normally-off type, and may include a Schottky gate electrode. In this case, a third gate electrode, which is a Schottky electrode, may be formed in the semiconductor multilayer 113 without forming the third p-type semiconductor layer. The transistor needs to be a normally-off HFET. Specifically, the thickness of the second semiconductor layer made of AlGaN is generally reduced, or the thickness of the second semiconductor layer under the third gate electrode is reduced by forming a gate recess. Alternatively, the third gate electrode may be made of a conductive oxide with a high work function.

While in FIGS. 9A-9D, the single-gate transistor unit includes the inactive region in the center, the inactive region is not necessarily in the center and may be in any position as long as it is inside the substrate potential stabilizing unit. In FIGS. 6A and 6B, the inactive region may be provided inside the diode unit and a resistor coupling the first ohmic electrode and the second ohmic electrode to the substrate may be formed. Where the resistive film can be sufficiently insulated from the semiconductor multilayer, the resistor may be formed not in the inactive region but in the active region.

FIGS. 6A, 6B and 9A-9D illustrate examples where the diode unit and the single-gate transistor unit is formed in the center of the semiconductor element to be surrounded by the double-gate transistor units. However, the diode unit and the single-gate transistor unit are not necessarily formed in the center of the semiconductor element.

In this embodiment, the semiconductor element is the normally-off double-gate semiconductor element, in which the gate electrode is formed on the p-type semiconductor layer. However, normally-off characteristics may be provided by forming a gate recess, or reducing the thickness of the second semiconductor layer. Depending on the circuit configuration, a normally-on double-gate semiconductor element may be used. While an example has been described where the substrate is a Si substrate, it may be a SiC substrate or other substrates in place of the Si substrate, as long as it is a conductive substrate on which a nitride semiconductor can be formed.

The bidirectional switch according to the present disclosure stably operates even if a wide-gap semiconductor is formed on a conductive substrate, and is particularly useful as a bidirectional switch etc. made of nitride semiconductor and formed on a conductive substrate.

What is claimed is:

1. A bidirectional switch comprising:
   a semiconductor element formed on a substrate, and including:
   a semiconductor multilayer;
   a first ohmic electrode and a second ohmic electrode, which are formed on the semiconductor multilayer and spaced apart from each other; and
   a first gate electrode and a second gate electrode which are sequentially formed from a side of the first ohmic electrode between the first ohmic electrode and the second ohmic electrode, wherein:
   a potential of the substrate is set lower than higher one of a potential of the first ohmic electrode or a potential of the second ohmic electrode by a substrate potential stabilizer, and
   the substrate potential stabilizer includes:
   a first resistor electrically coupled to the first ohmic electrode and the substrate; and a second resistor electrically coupled to the second ohmic electrode and the substrate.

2. The bidirectional switch of claim 1, wherein:
the semiconductor element includes a back surface electrode formed on a surface of the substrate, which is opposite to the semiconductor multilayer, and
the substrate potential stabilizer includes:
  a first diode including a cathode coupled to the first ohmic electrode, and an anode coupled to the back surface electrode; and
  a second diode including a cathode coupled to the second ohmic electrode, and an anode coupled to the back surface electrode.

3. The bidirectional switch of claim 2, wherein:
the first resistor is coupled to the back surface electrode,
the second resistor is coupled to the back surface electrode,
the first resistor is coupled to the first diode in parallel, and
the second resistor is coupled to the second diode in parallel.

4. The bidirectional switch of claim 1, wherein:
the substrate potential stabilizer includes:
  a first diode including a cathode coupled to the first ohmic electrode, and an anode coupled to the substrate; and
  a second diode including a cathode coupled to the second ohmic electrode, and an anode coupled to the substrate,
the anode of the first diode is a first anode electrode formed on the semiconductor multilayer,
the anode of the second diode is a second anode electrode formed on the semiconductor multilayer, and
the first anode electrode and the second anode electrode are coupled to the substrate via a through-hole interconnect penetrating the semiconductor multilayer.

5. The bidirectional switch of claim 4, wherein:
the first resistor couples the first anode electrode to the first ohmic electrode, and
the second resistor couples the second anode electrode to the second ohmic electrode.

6. The bidirectional switch of claim 4, wherein:
the first ohmic electrode includes a plurality of first ohmic electrode fingers,
the second ohmic electrode includes a plurality of second ohmic electrode fingers,
the first gate electrode includes a plurality of first gate electrode fingers,
the second gate electrode includes a plurality of second gate electrode fingers,
the semiconductor element includes a plurality of double-gate transistor units, each including the first gate electrode fingers and the second gate electrode fingers which are sequentially formed between the first ohmic electrode fingers and the second ohmic electrode fingers, and
the substrate potential stabilizer includes a diode unit including the first anode electrode and the second anode electrode which are sequentially formed between the first ohmic electrode fingers and the second ohmic electrode fingers.

7. The bidirectional switch of claim 1, wherein:
the semiconductor multilayer includes a channel region in which electrons move parallel to a principal surface of the substrate,
the substrate potential stabilizer includes a normally-off transistor including a third ohmic electrode and a fourth ohmic electrode, which are formed on the semiconductor multilayer, and a third gate electrode formed between the third ohmic electrode and the fourth ohmic electrode,
the first resistor is coupled between the first ohmic electrode and the third gate electrode, and
the second resistor is coupled between the second ohmic electrode and the third gate electrode,
the third ohmic electrode is coupled to the first ohmic electrode,
the fourth ohmic electrode is coupled to the second ohmic electrode, and
the third gate electrode is coupled to the substrate via a through-hole interconnect penetrating the semiconductor multilayer and insulated from the channel region.

8. The bidirectional switch of claim 7, wherein
the substrate potential stabilizer includes a p-type nitride semiconductor layer formed between the semiconductor multilayer and the third gate electrode.

9. The bidirectional switch of claim 7, wherein:
the semiconductor multilayer includes an inactive region having higher resistance than other regions, and
the through-hole interconnect is formed in the inactive region.

10. The bidirectional switch of claim 9, wherein:
the first resistor is a resistive film formed on the inactive region in contact with the first ohmic electrode and the third gate electrode, and
the second resistor is a resistive film formed on the inactive region in contact with the second ohmic electrode and the third gate electrode.

11. The bidirectional switch of claim 7, wherein:
the first ohmic electrode includes a plurality of first ohmic electrode fingers,
the second ohmic electrode includes a plurality of second ohmic electrode fingers,
the first gate electrode includes a plurality of first gate electrode fingers,
the second gate electrode includes a plurality of second gate electrode fingers,
the semiconductor element includes a plurality of double-gate transistor units, each including the first gate electrode fingers and the second gate electrode fingers which are sequentially formed between the first ohmic electrode fingers and the second ohmic electrode fingers,
the substrate potential stabilizer includes a single-gate transistor unit including the third gate electrode located between the first ohmic electrode fingers and the second ohmic electrode fingers,
the first ohmic electrode fingers included in the single-gate transistor unit form the third ohmic electrode, and
the second ohmic electrode fingers included in the single-gate transistor unit form the fourth ohmic electrode.

12. The bidirectional switch of claim 7, wherein
the semiconductor multilayer includes:
  a first semiconductor layer;
  a second semiconductor layer formed on the first semiconductor layer; and
  a high-resistive region under the third gate electrode, the high-resistive region penetrating the second semiconductor layer to reach a position closer to the substrate than an interface between the second semiconductor layer and the first semiconductor layer, and having higher resistance than other regions of the first semiconductor layer and the second semiconductor layer.

13. The bidirectional switch of claim 1, wherein:
the semiconductor element includes a back surface electrode formed on a surface of the substrate, which is opposite to the semiconductor multilayer, and
the first resistor is coupled between the first ohmic electrode and the back surface electrode, and the second resistor is coupled between the second ohmic electrode and the back surface electrode.

14. The bidirectional switch of claim 1, wherein:
the first resistor forms a first current path between the first ohmic electrode and the substrate, and
the second resistor forms a second current path between the second ohmic electrode and the substrate.

15. The bidirectional switch of claim 5, wherein:
the semiconductor multilayer includes an inactive region having higher resistance than other regions,
the first resistor is a resistive film formed on the inactive region in contact with the first ohmic electrode and the first anode electrode, and
the second resistor is a resistive film formed on the inactive region in contact with the second ohmic electrode and the second anode electrode.

* * * * *